United States Patent [19]

Iggulden et al.

[11] Patent Number: 5,729,222
[45] Date of Patent: Mar. 17, 1998

[54] USER-CONFIGURABLE CONTROL DEVICE

[75] Inventors: Jerry Iggulden, 6345 Balboa Blvd., Suite 175, Encino, Calif. 91316; Richard Crack, Burnaby, Canada; Nigel Taylor, Maple Ridge, Canada; Bruce Stevens; Keith Constable, both of Coquitlam, Canada; Derek Pyner, Delta, Canada

[73] Assignee: Jerry Iggulden, Burbank, Calif.

[21] Appl. No.: 756,274

[22] Filed: Nov. 25, 1996

Related U.S. Application Data

[63] Continuation of Ser. No. 479,835, Jun. 7, 1995, Pat. No. 5,579,002, which is a continuation of Ser. No. 147,855, Nov. 5, 1993, abandoned, which is a continuation-in-part of Ser. No. 65,598, May 21, 1993, abandoned.

[51] Int. Cl.$^6$ .................................................. H03K 17/94
[52] U.S. Cl. ............................ 341/31; 341/22; 250/221
[58] Field of Search ................................ 341/22, 23, 26, 341/30, 31, 34; 200/5 A, 329, 341, 345; 250/229, 221; 348/734

[56] References Cited

U.S. PATENT DOCUMENTS

| Re. 28,365 | 3/1975 | Braue ........................ 200/86 |
| 3,308,253 | 3/1967 | Krakinowski ................ 200/46 |
| 3,522,664 | 8/1970 | Lambright et al. . |
| 3,600,528 | 8/1971 | Leposavic . |
| 3,617,660 | 11/1971 | Krakinowski ................ 200/1 |
| 3,627,935 | 12/1971 | Spievak . |
| 3,641,286 | 2/1972 | Berezowski . |
| 3,688,066 | 8/1972 | Adelson et al. . |
| 3,693,775 | 9/1972 | Brooks et al. ................ 197/98 |
| 3,699,294 | 10/1972 | Sudduth . |
| 3,761,944 | 9/1973 | Shimojo .................... 340/365 |
| 3,856,127 | 12/1974 | Halfon et al. ................ 341/31 |
| 4,106,216 | 8/1978 | Boehm ........................ 35/9 |
| 4,280,121 | 7/1981 | Crask ........................ 340/365 |

(List continued on next page.)

FOREIGN PATENT DOCUMENTS

| 3 309 817 | 9/1984 | Germany . |
| 878 324 | 11/1981 | U.S.S.R. . |
| 2 103 943 | 3/1983 | United Kingdom . |
| 2 188 850 | 10/1987 | United Kingdom . |

OTHER PUBLICATIONS

"Customizable Keys Using Add-On 'Plugs'", *IBM Technical Disclosure Bulletin*, vol. 33, No. 1B, Jun. 1990, pp. 426–429.

D.O. Johnson, Jr., "Keyboard with Changeable Encoding and Key Designation", *IBM Technical Disclosure Bulletin*, vol. 13, No. 7, Dec. 1970, pp. 2041–2042.

Green, Bill, "Build A Computer–vs.–You Chess Game", *Popular Electronics*, Dec. 1978, pp. 49–58.

"Sensory Chess Challenger", *Fidelity Electronics, Ltd.*, Advertisement, Aug. 1980.

*Primary Examiner*—Jeffery Hofsass
*Assistant Examiner*—Andrew Hill
*Attorney, Agent, or Firm*—Blakely, Sokoloff Taylor & Zafman

[57] ABSTRACT

A user configurable control device is particularly suitable for household devices such as remote control transmitters. A variety of function control elements in the form of keys are provided to the consumer who selects a desired set of the control elements. Each of the control elements has a unique pattern of projections molded into the bottom surface. These projections are in operative alignment with an array of membrane switches disposed on a switching substrate within the control device. The control device includes a front panel that is perforated with a pattern of slots. Each of the control elements has a pair of projecting tabs that lock the element onto the control panel so that it is securely retained thereon, but may be released if desired. The projections on the bottom of the element extend through the slots in the front panel to the switching substrate below. The particular pattern of projections is unique to each control element and the corresponding pattern of switch contacts closed upon actuation of the control element determines the function that is performed.

6 Claims, 7 Drawing Sheets

U.S. PATENT DOCUMENTS

| | | | |
|---|---|---|---|
| 4,304,991 | 12/1981 | Weber | 235/442 |
| 4,343,609 | 8/1982 | Cardinal | 434/128 |
| 4,349,286 | 9/1982 | Blaser et al. | 400/492 |
| 4,376,538 | 3/1983 | Keenan | 273/275 |
| 4,382,702 | 5/1983 | Fessel | 400/144 |
| 4,391,447 | 7/1983 | Dudley | 273/238 |
| 4,398,720 | 8/1983 | Jones et al. . | |
| 4,412,218 | 10/1983 | Niitsu | 340/825 |
| 4,440,515 | 4/1984 | Nassimbene | 400/479 |
| 4,468,612 | 8/1984 | Starr | 324/66 |
| 4,479,111 | 10/1984 | Madsen et al. | 341/31 |
| 4,492,581 | 1/1985 | Arai et al. | 434/128 |
| 4,493,219 | 1/1985 | Sharp et al. | 73/862 |
| 4,511,769 | 4/1985 | Sahakian et al. | 200/6 |
| 4,526,550 | 7/1985 | Lurito | 434/340 |
| 4,567,469 | 1/1986 | Danish et al. | 340/365 |
| 4,633,227 | 12/1986 | Menn | 340/365 |
| 4,688,020 | 8/1987 | Kuehneman et al. | 340/365 |
| 4,696,860 | 9/1987 | Epperson | 428/325 |
| 4,700,025 | 10/1987 | Hatayama et al. | 200/5 |
| 4,745,397 | 5/1988 | Lagerbauer et al. | 340/365 |
| 4,746,919 | 5/1988 | Reitmeier | 340/825 |
| 4,803,316 | 2/1989 | Hayashi et al. | 200/406 |
| 4,825,200 | 4/1989 | Evans et al. | 341/23 |
| 4,831,219 | 5/1989 | Sugiura et al. | 200/5 |
| 4,855,740 | 8/1989 | Muramatsu et al. | 341/23 |
| 4,857,898 | 8/1989 | Smith | 341/22 |
| 4,878,055 | 10/1989 | Kasahara | 341/23 |
| 4,890,832 | 1/1990 | Komaki | 273/1 E |
| 4,906,117 | 3/1990 | Birdwell | 400/490 |
| 4,954,823 | 9/1990 | Binstead | 341/26 |
| 4,965,421 | 10/1990 | Epperson | 200/514 |
| 4,969,650 | 11/1990 | Magara et al. | 273/238 |
| 4,981,300 | 1/1991 | Winkler | 273/238 |
| 5,006,842 | 4/1991 | Tobol | 340/825 |
| 5,013,047 | 5/1991 | Schwab | 273/238 |
| 5,036,191 | 7/1991 | Senoo | 341/31 |
| 5,038,401 | 8/1991 | Inotsume | 455/92 |
| 5,063,484 | 11/1991 | Tanaka | 362/109 |
| 5,075,686 | 12/1991 | Shigemura | 341/23 |
| 5,082,286 | 1/1992 | Ryan et al. | 273/238 |
| 5,098,106 | 3/1992 | Hegener . | |
| 5,129,654 | 7/1992 | Bogner | 273/238 |
| 5,145,058 | 9/1992 | Lee | 200/517 |
| 5,145,182 | 9/1992 | Swift et al. . | |
| 5,146,153 | 9/1992 | Luchaco et al. | 323/324 |
| 5,150,118 | 9/1992 | Finkle et al. | 341/23 |
| 5,151,696 | 9/1992 | Kasahara et al. | 341/22 |
| 5,164,723 | 11/1992 | Nebenzahl | 341/23 |
| 5,182,551 | 1/1993 | Goto | 340/825 |
| 5,188,368 | 2/1993 | Ryan | 373/237 |
| 5,253,940 | 10/1993 | Abecassis | 400/495 |

USER-CONFIGURABLE CONTROL DEVICE

RELATED APPLICATION

This is a continuation of application Ser. No. 08/479,835 filed on Jun. 7, 1995, now U.S. Pat. No. 5,579,002, which is a continuation of Ser. No. 08/147,855 filed on Nov. 5, 1993, now abandoned, which is a continuation-in-part of Ser. No. 08/065,598 filed May 21, 1993, abandoned.

BACKGROUND OF THE INVENTION

1. Field of the Invention

This invention relates generally to the field of multi-function control devices, and more particularly to a user-configurable device wherein a set of relocatable control elements, such as keys, are provided, each of which possesses a unique identification that is associated with a corresponding function.

2. Prior Art

One of the problems associated with increasingly sophisticated electronic devices is providing a "user friendly" interface for controlling the functions of such devices. For example, in the field of home entertainment electronics, the number of features and functions available to the consumer is growing at a staggering rate. Consequently, the function controls for these devices, which are commonly provided in the form of a wireless infrared transmitter, are increasingly complex and have become incomprehensible to many users. Many of the functions provided are seldom, if ever, used by many consumers. Moreover, there has been virtually no standardization of the keypad arrangement for remote control devices. The consumer must therefore learn and adapt to the arrangement of each such device.

Various ways of providing configurable keypads and keyboards are known in the prior art. For example, U.S. Pat. No. 5,151,696 discloses a remote control device in which an array of keys may be assigned different functions by means of a mode change over switch. Movement of the switch to different positions causes different markings to be displayed adjacent to each of the keys to identify the associated functions. The keys, however, are fixed in position on the keyboard and selected functions are determined based on the position of the key that is actuated.

U.S. Pat. No. 5,038,401 discloses a remote control transmitter having a transparent touch panel display. The arrangement of the touch panel is varied in accordance with an operator selection and may be further varied in accordance with the frequency with which particular functions are selected. Here again, functions are mapped to particular switch locations on the keyboard.

U.S. Pat. No. 4,688,020 discloses a reconfigurable keyboard which has a matrix of predefined key switch locations. Keys are provided for a selected subset of the key switch locations and a key table, stored in a memory device, defines the functions of each of the key locations.

U.S. Pat. No. 5,150,118 discloses a configurable keyboard having interchangeable membrane-activated keypad assemblies. Each of the keypad assemblies is coded so that when it is installed in the keyboard a particular set of keyboard functions is enabled.

An IBM Technical Disclosure Bulletin (Volume 33, No. 1B, June 1990) entitled "Customizable Keys Using Add-On 'Plugs'" discloses a computer terminal keyboard in which each of the individual keys includes a digital code. The code is implemented by connecting each of eight conductive lines within the body of the key to either ground or a supply voltage. These conductive lines are attached to exposed contacts at the base of the key. The keyboard has an array of receptacles, each of which has a set of contacts for engaging the exposed contacts on the base of the key. When one of the keys is actuated, a switch within the key base is closed and the digital code is then read and sent to the using device. In IBM's keyboard, the functional identification of the keys is physically associated with the keys themselves so that the same functions are controlled regardless of where the keys are placed on the keyboard.

Self-contained identification techniques have been employed for certain games. For example, U.S. Pat. No. 4,969,650 discloses a game machine in which each of a plurality of movable playing pieces has a rank identification which can be interpreted by an electronic processor within the game board. Each of the game pieces has a pattern of projections on the bottom surface which close corresponding electrical contacts on the game board.

SUMMARY OF THE INVENTION

The present invention provides a practical and economic solution for a user configurable keyboard. A plurality of individual control elements, typically in the form of keys, have corresponding functions uniquely associated therewith. Each of the control elements is physically configured to possess a unique identification corresponding to the associated function. This identification, being a property of the control element itself, is invariant wherever the element is placed on a keypad or other suitable control surface.

In a typical embodiment of the invention, a selected subset of a plurality of keys is placed by the user on a keypad in any desired arrangement. A sensor associated with the keypad detects the unique identification of an actuated one of the keys. A memory device stores a library of all identification values together with the corresponding functions. A control unit receives the detected identification of the actuated key and retrieves the associated function from the memory device. The control unit then implements the selected function. In the case of a remote control device, implementation of the selected function entails transmitting an appropriate remote command associated with the selected function.

In a preferred embodiment of the invention that is particularly suitable for household devices such as remote control transmitters, each of the control elements has a unique pattern of projections molded into the bottom surface. These projections are in operative alignment with an array of membrane switches disposed on a switching substrate within the control device. The control device includes a front panel that is perforated with a pattern of slots. Each of the control elements has a pair of projecting tabs that lock the element onto the control panel so that it is securely retained thereon, but may be released if desired. The projections on the bottom of the element extend through the slots in the front panel to the switching substrate below. The dimensions of the slots, together with the configuration of the front panel, obscures the vacant slots so that it is not visually apparent that some of the receiving sites for the control elements are empty.

The switching membrane is preferably molded to form a dome-like structure at each of the available control element sites. The resilience of this structure provides tactile feedback upon operation of the control element. Alteratively, a separate resilient support may be provided for the control elements in which case a flat switch membrane may be employed.

Various other techniques may be utilized to provide the individual control elements with unique identifications. One such technique employs an array of optical sensors in a control substrate. Each of the control elements has a unique pattern of apertures that selectively allow radiant energy to strike the corresponding sensors. The source of radiant energy may be provided within the control element or may be in the form of infrared energy radiated by the human body.

Other identification techniques incorporate an electrical component within the body of the control element which is configured to complete an electrical circuit when the element is actuated. The electrical component, which may be a resistor, capacitor, inductor, conductor, semiconductor or any combination of such components, has a unique circuit value for each of the control elements.

The present invention has application for performing display functions as well as control input functions. Thus, individual display elements may likewise be provided with unique self-contained identification characteristics. The display function associated with each such element is thus performed wherever the element is placed on the receiving substrate.

DETAILED DESCRIPTION OF THE INVENTION

In the following description, for purposes of explanation and not limitation, specific details am set forth in order to provide a thorough understanding of the present invention. However, it will be apparent to one skilled in the art that the present invention may be practiced in other embodiments that depart from these specific details. In other instances, detailed descriptions of well-known methods, devices and circuits are omitted so as to not obscure the description of the present invention with unnecessary detail.

The present invention is described in the context of a remote control transmitter for consumer electronic devices, such as televisions, VCRs, stereos, etc. However, this is but one specific application of the invention which may be applied in virtually any situation where it is desired to have manual selection of one of a multiplicity of functions.

Figure 1:
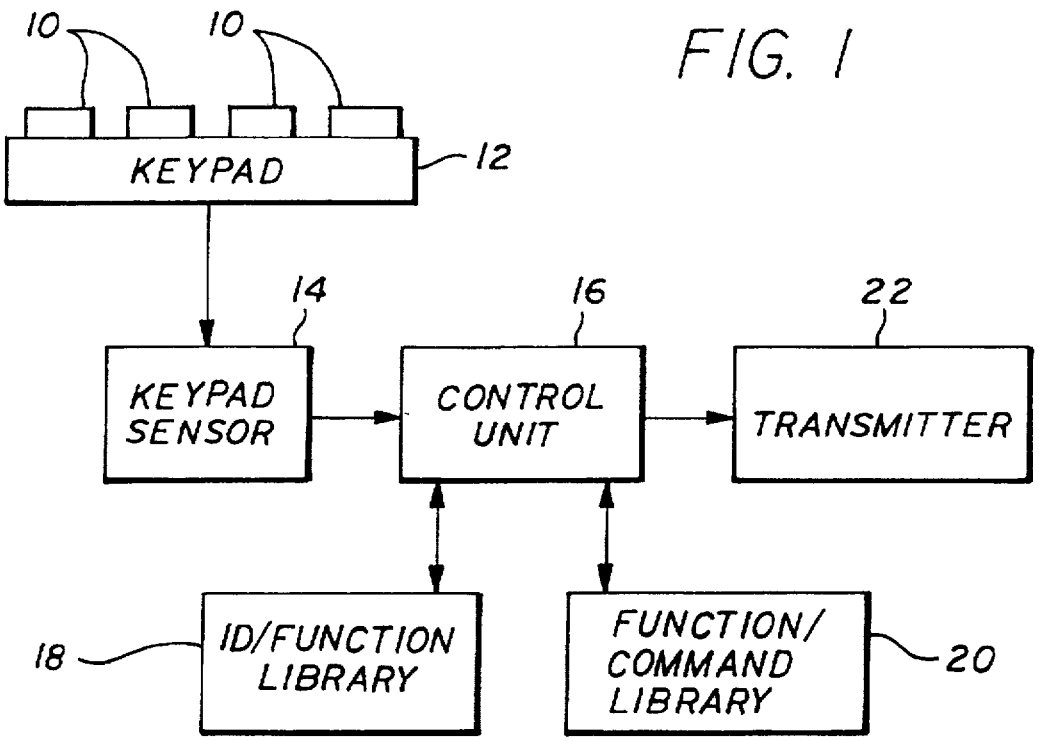
FIG. 1 is a functional block diagram of a remote control device constructed in accordance with the present invention.

FIG. 1 is a functional block diagram of a remote control transmitter constructed in accordance with the present invention. A plurality of manually operated keys 10 are disposed on a keypad 12. As will be more fully explained below, each of keys 10 possesses a unique identification. When one of keys 10 is depressed by a user, the identification thereof is sensed by keypad sensor 14, which then communicates the sensed identification to control unit 16. In most applications, control unit 16 would be implemented with a microprocessor.

Each of the possible key identifications is assigned a corresponding unique function. In the context of a remote control transmitter for a television, such functions would include, for example, POWER ON, VOLUME UP, VOLUME DOWN, CHANNEL UP, CHANNEL DOWN, etc. The correspondence between the various possible key identifications and their associated functions is maintained in an ID/function library 18 coupled to control unit 16. Preferably, library 18 will include a comprehensive list of all possible identifications and associated functions. The contents of such list may be predetermined by the manufacturer of the device. Library 18 may thus be conveniently embodied in a read only memory (ROM) device. When control unit 16 receives a sensed identification from keypad sensor 14, the associated function is retrieved from library 18. Some of the keys may control more than a single function. For example, one function may ordinarily be associated with a key, but another function may be selected if the same key is "double-clicked".

In order to implement the desired function, control unit 16 interrogates library 20 which maintains a list of functions and the corresponding remote commands. Library 20 is preferably implemented in a non-volatile random access memory (RAM) so that the remote commands appropriate for the particular devices to be controlled may be learned and stored in library 20. Once the appropriate remote command is retrieved from library 20, control unit 16 communicates the command to transmitter 22, which is most typically an infrared transmitter. The command for the desired function is thus sent to the device under control where the function is executed.

Figure 2:
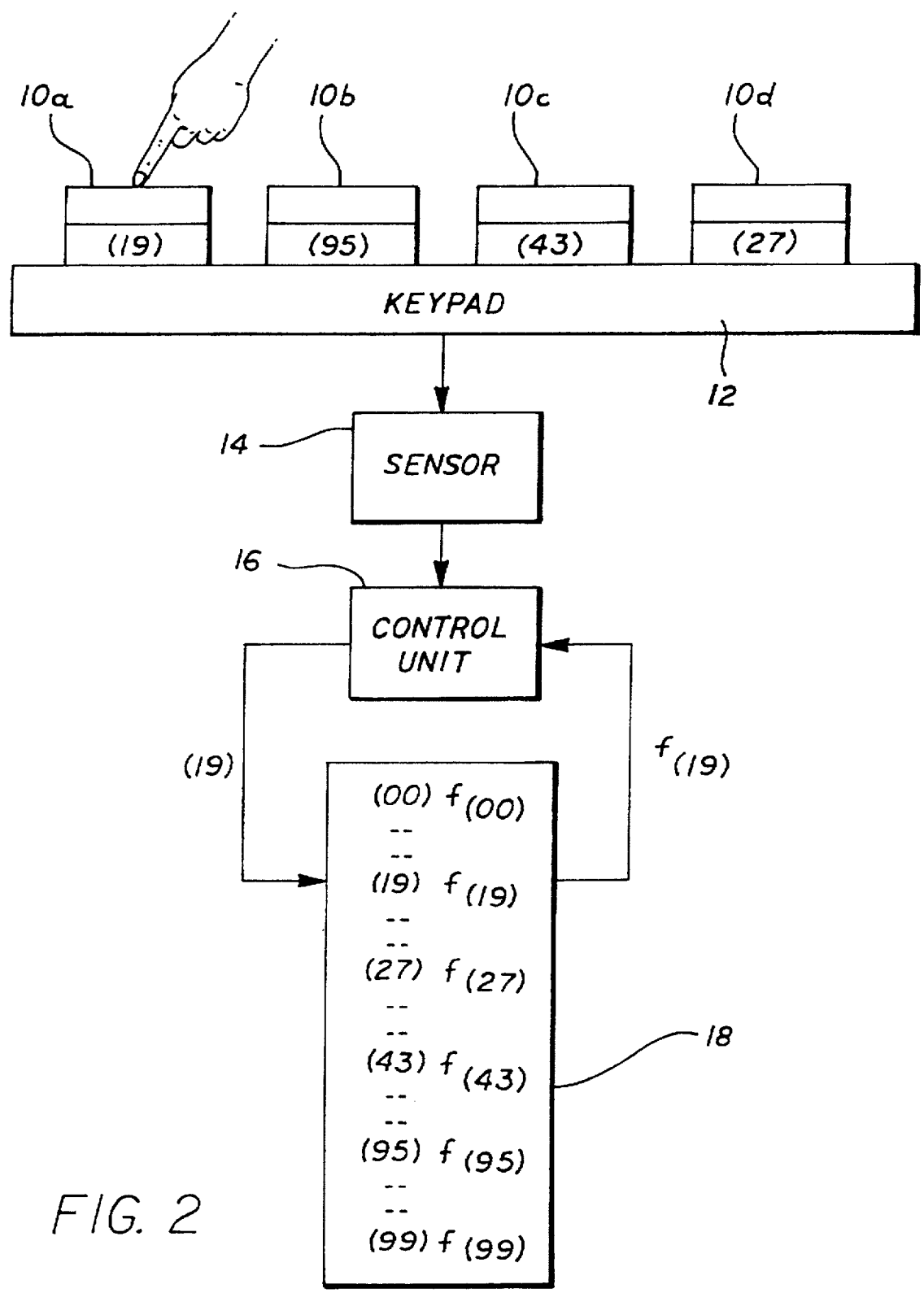
FIG. 2 illustrates selection of a function using the device of FIG. 1.

Referring now to FIG. 2, the use of unique key identifications will be more fully explained. In the example illustrated, 100 unique key identifications are available and are represented by the coded identifiers (00)–(99). Each of the keys 10 physically contains a unique characteristic or parameter that is capable of being sensed. For example, keys 10 may each contain an electrical component having a unique circuit value, such as a resistance value, capacitance value or inductance value. In other embodiments, keys 10 may contain resonant circuits, each tuned to a unique frequency. In still other embodiments, keys 10 may be mechanically encoded with unique shapes or unique patterns of protuberances for actuating electrical contacts. In any case, each of the keys 10 possess a unique identification that remains with that particular key no matter where it is placed on the keypad 12.

In order to maximize the extent of user configurability, an assortment of keys 10 are provided to the user who may then select the desired functions and may place the selected keys anywhere on the surface of keypad 12 so as to achieve the most convenient configuration for that particular user. In the example illustrated in FIG. 2, four keys 10a–10d have been selected for placement on keypad 12 and contain the unique identifications denoted by codes (19), (95), (43) and (27), respectively. Each of the keys 10a–10d is marked with a legend or other indicia to identify the function that is uniquely associated with the key. Thus, for example, code (19) may be associated with the function POWER ON and key 10a would have a corresponding marking.

When the user manually operates key 10a, keypad sensor 14 senses the key identification denoted by code value (19). As mentioned above, the identification may be expressed as a unique electrical parameter, such as a resistance value. This value is communicated to control unit 16 which then interrogates library 18. Library 18 contains a list of all possible identifications (00)–(99) and their unique associated functions $f_{(00)}$–$f_{(99)}$. Control unit 16 thus retrieves function $f_{(19)}$ which, as indicated above, may be defined as POWER ON. The user is thus free to configure the device with any desired subset of the entire library of functions. Regardless of where the selected keys are placed on keypad 12, the uniqueness of the identifying characteristic of each of the keys ensures that the desired function will always be selected when the corresponding key is pressed or otherwise actuated.

The individual control elements, or keys, may be configured with a single "active" surface that communicates its unique identification to the keypad sensor and a corresponding single marking to designate the associated function. However, to reduce the total numbers of individual keys, some of the keys may be configured as button-shaped devices with two active surfaces. In this case, an appropriate functional marking would be provided on the surface opposite the corresponding active surface. By extension, three-dimensional control elements may be provided with a plurality of active surfaces. For example a small cube resembling a die could provide control capabilities for six different functions. It is preferable, although not necessary, that any such multi-function control element control a set of functions that a typical consumer would not ordinarily desire to have available simultaneously so that such element need not be frequently reoriented.

Figure 3:
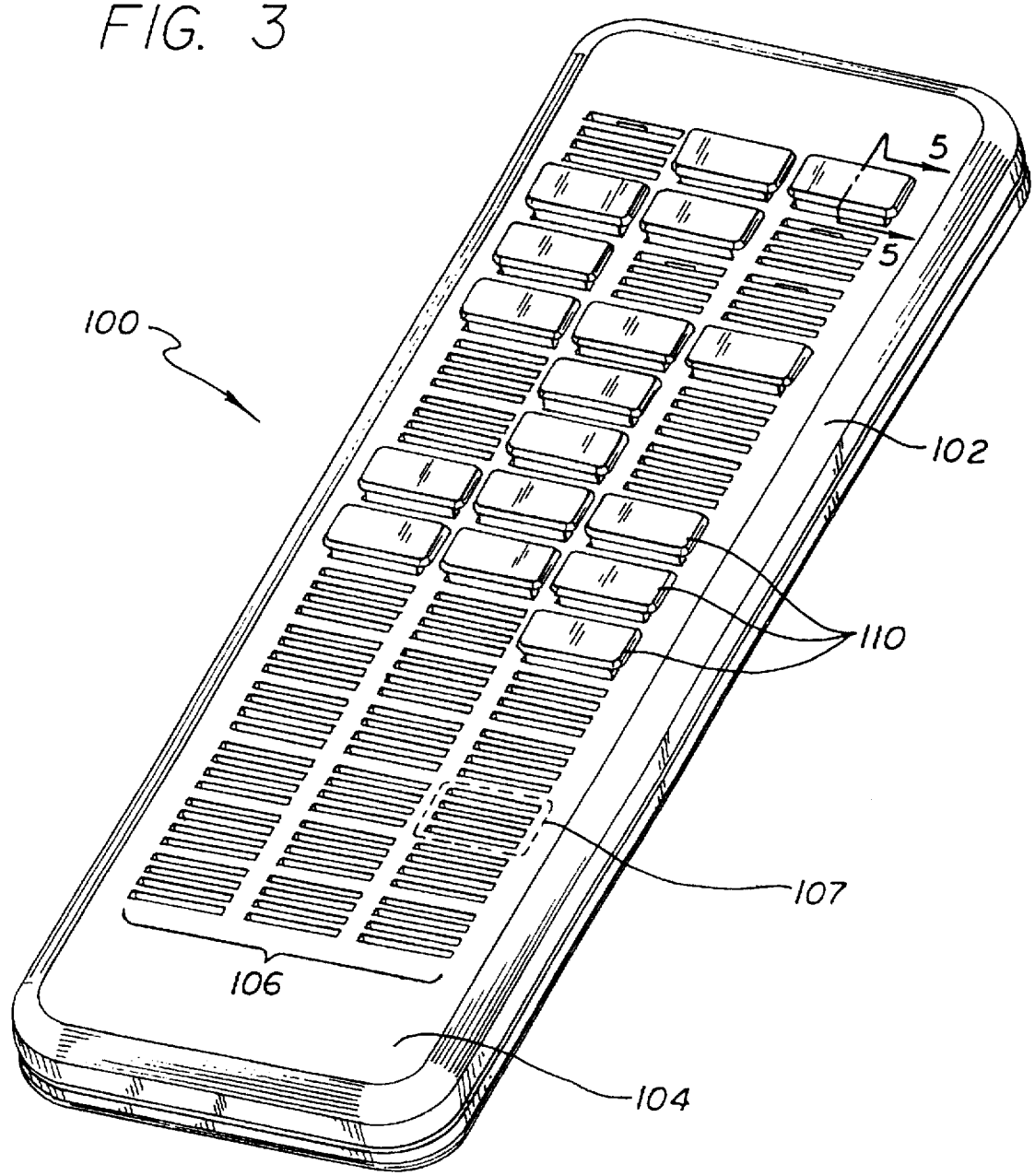
FIG. 3 is a perspective view of a remote control device constructed in accordance with the present invention.

FIG. 3 is a perspective view of an exemplary remote control device 100 constructed in accordance with the present invention. A housing 102 includes a front panel 104. A selection of keys 110 are placed at desired positions on from panel 104. A plurality of slots 106 are provided for receiving the selected keys. As illustrated in the drawing, three columns of slots are provided; however, these slots may be arranged in any manner desired. In this particular embodiment, slots 106 are arranged in groups of four, with each of keys 110 spanning a group of four slots. Each group of four slots defines a key site 107. The selected keys 110 may be placed at any of the key sites on panel 104.

It should be observed that slots 106 are relatively small in size. This helps prevent entry of contaminating materials such as dirt, food crumbs, etc. into the interior of housing 102. The small size of the slots 106 also helps obscure the fact that some of the key sites may be vacant, thereby giving device 100 a more pleasing appearance when the available key sites are not fully populated. This latter aspect of the invention may be enhanced by debossing front panel 104 with kerfs or grooves between adjacent slots 106. With such relief added to panel 104, slots 106 become virtually invisible, particularly if panel 104 has a black finish.

Although housing 102 is shown with a front panel 104 for receiving keys 110, other arrangements are well within the scope of the present invention. For example, a double-sided housing may be provided with both front and rear panels capable of accommodating keys 110. Such an arrangement would be useful, for example, to provide a numeric keypad on one panel and selected function controls on another. Alternatively, each panel may be used for function controls related to a separate device.

Housing 102 contains all of the various functions illustrated in FIG. 1. In particular, It contains all of the control electronics and the infra-red transmitter. Since the ID/function library is pre-programmed with all known and anticipated functions for which key controls are provided, the functionality of device 100 will be limited only by the surface area of panel 104 that is available for placement of keys 110. As already indicated, a selected subset of the keys will typically be placed on panel 104 and the remainder of the keys will either be suitably stored or discarded. Housing 102 may include a storage compartment for storing the remaining keys 110 that are not selected for placement on front panel 104 or perhaps a secondary subset of keys that are used relatively infrequently.

Figure 4:
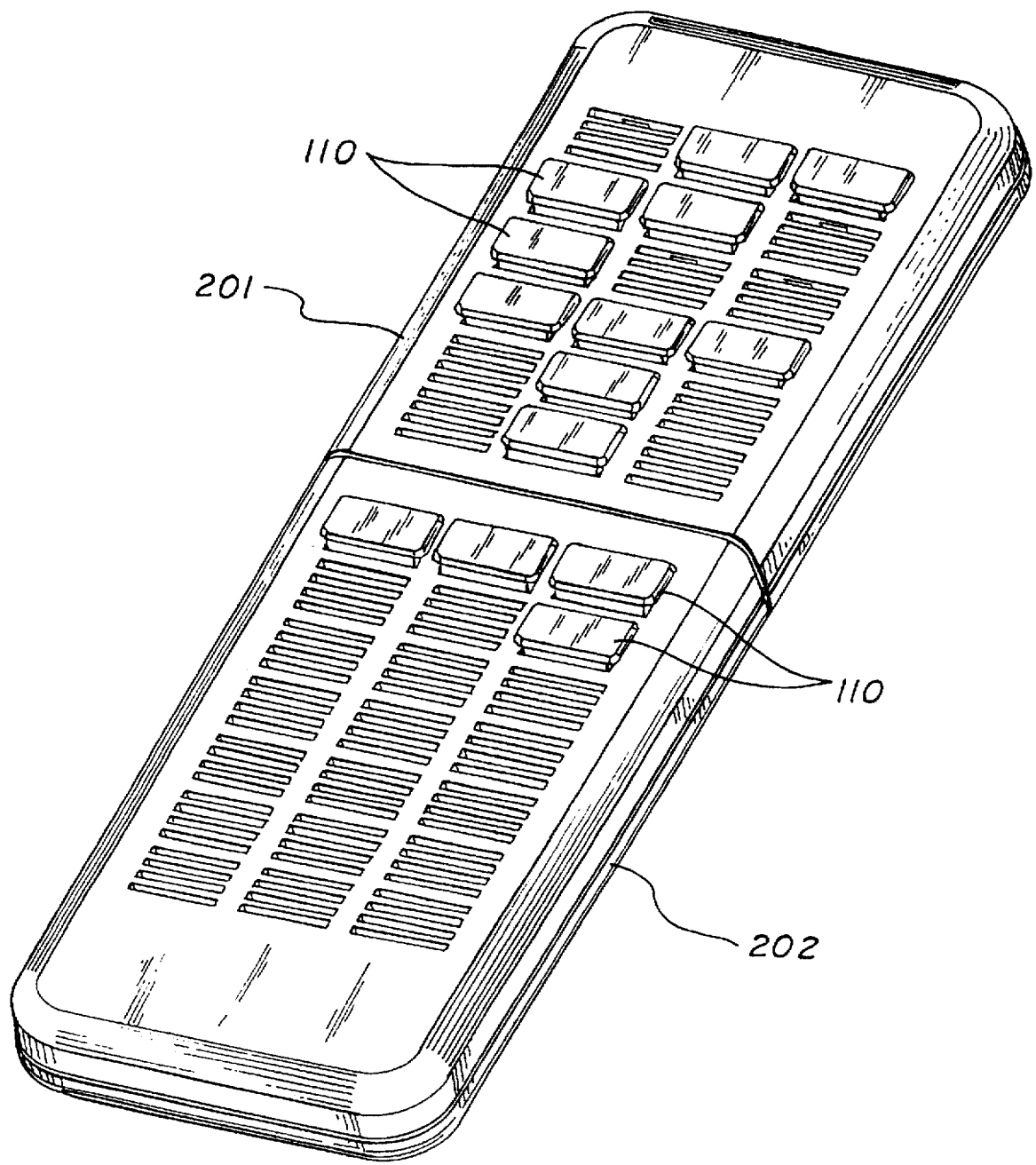
FIG. 4 is a perspective view of a modified form of the remote control device shown in FIG. 3.

Since different users will desire to incorporate different degrees of functionality in device 100, the device may be conveniently configured as shown in FIG. 4 with a master unit 201 and a slave unit 202. Master unit 201 includes all of the control electronics and the infra-red transmitter, as well as a battery power supply. Slave unit 202 plugs into master unit 201 by means of a suitable connector and simply provides additional surface area for placement of additional keys 110. In this way, the overall size of master unit 201 can be kept reasonably compact and yet still accommodate the greater functionality desired by some users. It should be noted that either master unit 201 or slave unit 202 may be entirely conventional with respect to the type of control elements that are used. For example, slave unit 202 may have a numeric keypad implemented with conventional push buttons. Indeed, both the master and slave units may utilize conventional controls.

Figure 5:
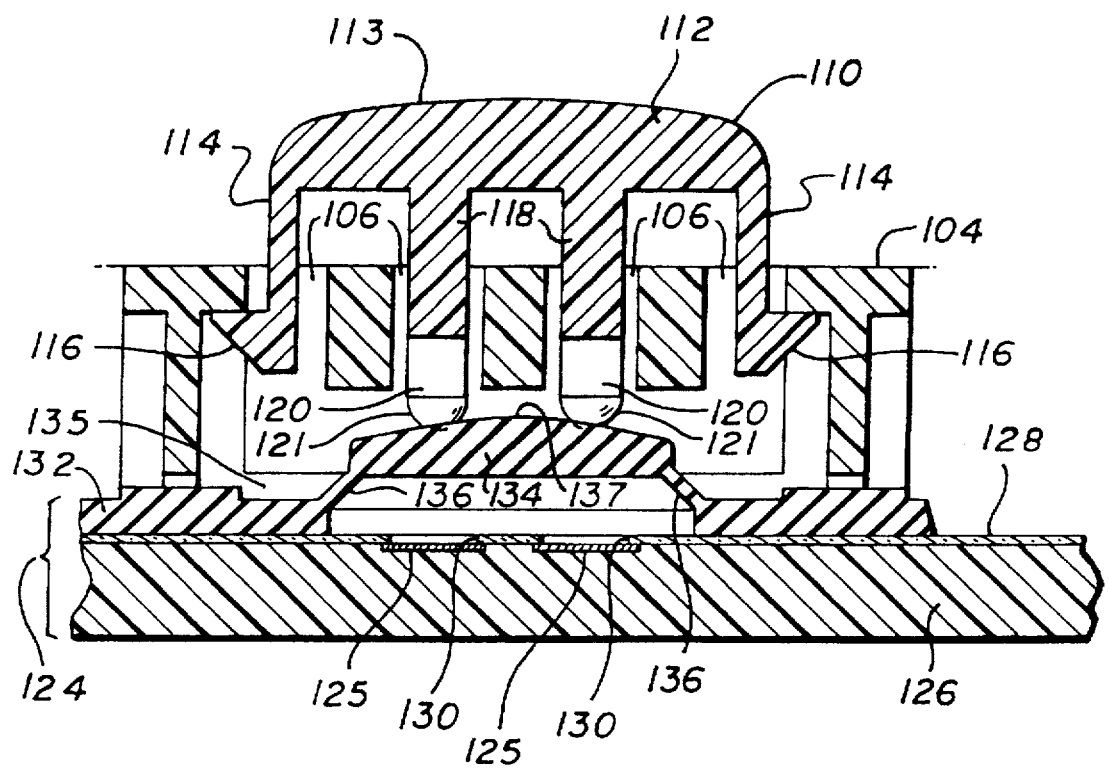
FIG. 5 is a cross-sectional view taken at line 5—5 of FIG. 3.
Figure 6:
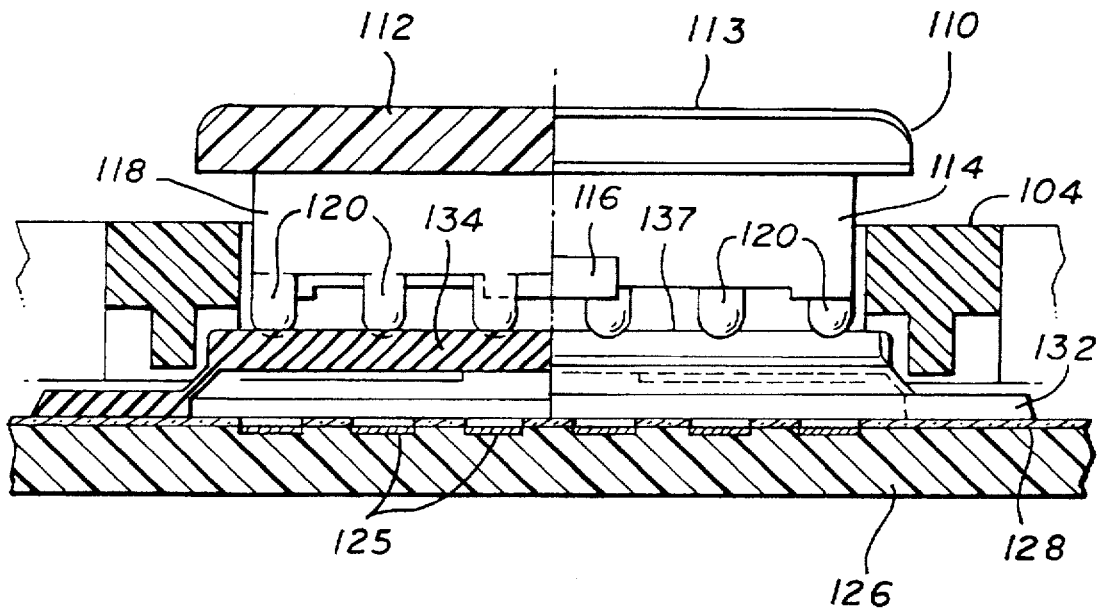
FIG. 6 is a broken cross-sectional view transverse to the view of FIG. 5.

FIG. 5 is a cross-sectional view taken at line 5—5 of FIG. 3 showing one of the keys 110 installed in device 100. FIG. 6 is a broken cross-sectional view transverse to FIG. 5 showing the same key 110. Body portion 112 has a generally rectangular shape with a slightly rounded top surface 113. Skirts 114 extend downwardly through respective slots 106 along the two longer side edges of body portion 112. Tabs 116 extend outwardly from each of skirts 114. Tabs 116 act to retain key 110 by hooking below panel 104 as illustrated. The skirts 114 and the dividers between slots 106 are sufficiently flexible so that key 110 can be easily snapped into place. With slight pressure, skirts 114 can be urged towards each other to facilitate removal of key 110 from device 100 when desired. The dexterity and force required to remove key 110 are such that it cannot easily be removed by a child, thereby providing an important safety feature.

Figure 7:
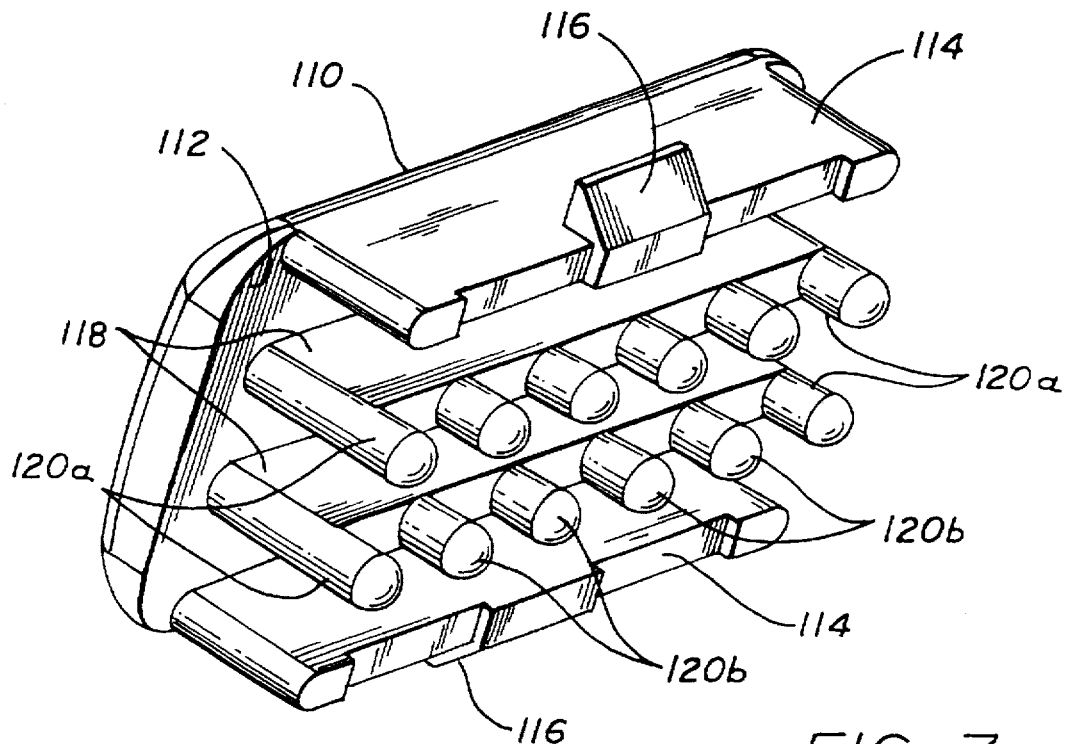
FIG. 7 is a perspective view showing the underside of the key shown in FIGS. 5 and 6.

Referring now also to FIG. 7, a pair of ridges 118 extend downwardly from body portion 112 in a longitudinal direction of key 110. Each of ridges 118 also extends through a respective slot 106 in housing 102. A plurality of switch probes 120 extend downwardly from ridges 118. Switch probes 120 have a generally cylindrical shape with rounded tips 121. The identification of each individual key 110 is communicated by the particular positions of switch probes 120. As shown in FIG. 7, there are a total of twelve switch probes. The four corner probes 120a are always present. However, the remaining eight data probes 120b will be selectively omitted, depending upon the identification to be encoded in the particular key. In this manner, a total of 256 key identifications are possible.

Switch substrate 124 is disposed within housing 102. Substrate 124 comprises a printed circuit board 126 on which a pattern of contacts 125 and connecting traces is etched. In some applications, a flexible material with suitable conductive contacts may be used instead of a printed circuit board. The pattern of contacts below each key site 107 corresponds to the pattern of switch probe locations on keys 110. Thus, there are twelve contacts at each key site arranged in two rows of six contacts each. The contacts are coupled to respective conductive traces that communicate with an associated processor to interpret the digital code of the actuated key.

Printed circuit board 126 may be fabricated from a copper-clad epoxy material using conventional printed circuit fabrication techniques. A dielectric layer 128 is applied over the etched circuit board 126. Layer 128 may be applied with a printing process such as is used for applying solder mask or may be applied as a thin sheet of material. Regardless of the manner in which layer 128 is applied, apertures 130 are positioned over each of the contact pads 125 on printed circuit board 126. Consequently, these apertures are also aligned with the switch probes 120.

Conductive membrane 132 is disposed above dielectric layer 128 and is preferably coupled to ground potential. Membrane 132 is preferably molded from a conductive elastomeric material. This may be silicone rubber impregnated with carbon, silver or another suitable conductive material. Membrane 132 is molded to form a generally domed structure 134, referred to as a "key bell", at each of the key sites. Membrane 132 may be selectively impregnated with conductive material only at the top surfaces 137 of key bells 134 rather than being uniformly impregnated throughout. This should result in a longer service life for the membrane since the impregnated material is more easily fatigued in web portions 136. The key bell 134 facilitates both the electrical switching function as described below and also mechanically biases key 110 in an upward direction. Web portions 136 are configured to provide sufficient resistance to downward movement of key 110 so as to provide the desired amount of tactile feedback. Aside from providing a resilient support for keys 110, key bells 134 also serve to prevent contaminants from interfering with the proper operation of the keys. Any materials that may enter through slots 106 will tend to collect within wells 135 between adjacent key bells 134.

Depression of key 110 must first overcome the resilience of the membrane at web portions 136, after which key bell 134 is pressed into local contact with circuit board 126 through apertures 130 by switch probes 120. The contacts corresponding to locations at which switch probes 120 are present will thus be grounded, whereas the contacts where switch probes have been omitted will remain in an open circuit state.

In the illustrated embodiment, key 110 has a maximum of twelve switch probes arranged in two rows of six each. All keys have the corner probes 120a; however, as explained above, the central eight switch probe positions are selectively populated to convey the unique identification of each key. In order to ensure that the correct code is read upon actuation of one of the keys, contact closure is required at all four of the corner, or guard, probes 120a. Thus, if a key is pressed in such a manner that fewer than all four guard contacts are closed, a mis-strike is declared and whatever information may be present on the data lines is ignored. On the other hand, if all four guard contacts are closed, it may be reasonably inferred that all of the data probes 120b have likewise closed their corresponding contacts and, therefore, that the data is valid.

Keys 110 are preferably fabricated by injection molding with a suitable plastic material. This permits keys 110 to be manufactured at an extremely low cost. In turn, this makes it possible to economically provide the consumer with a wide assortment of function control keys. It will be appreciated that indicia identifying the particular function associated with each of the keys may be conveniently molded directly into the top surface 113 so that the function identifying indicia are permanently related to the configuration of the switch probes at the time of manufacture. Alternatively, in some cases, it may be desirable to manufacture keys 110 with all eight data probes 120b in place. Selected ones of the data probes may then be broken off to provide the desired code, and appropriate indicia may then be applied to top surface 113.

Figure 8:
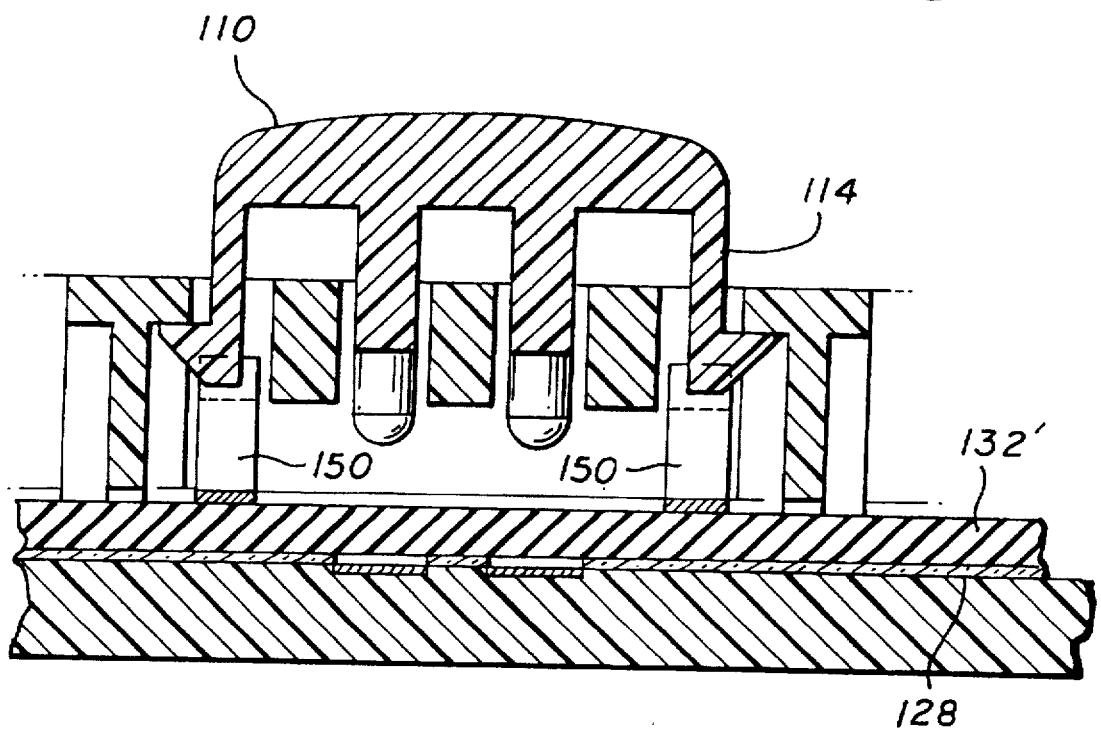
FIG. 8 is a cross-sectional view of an alternative embodiment using a flat switching membrane.
Figure 9:
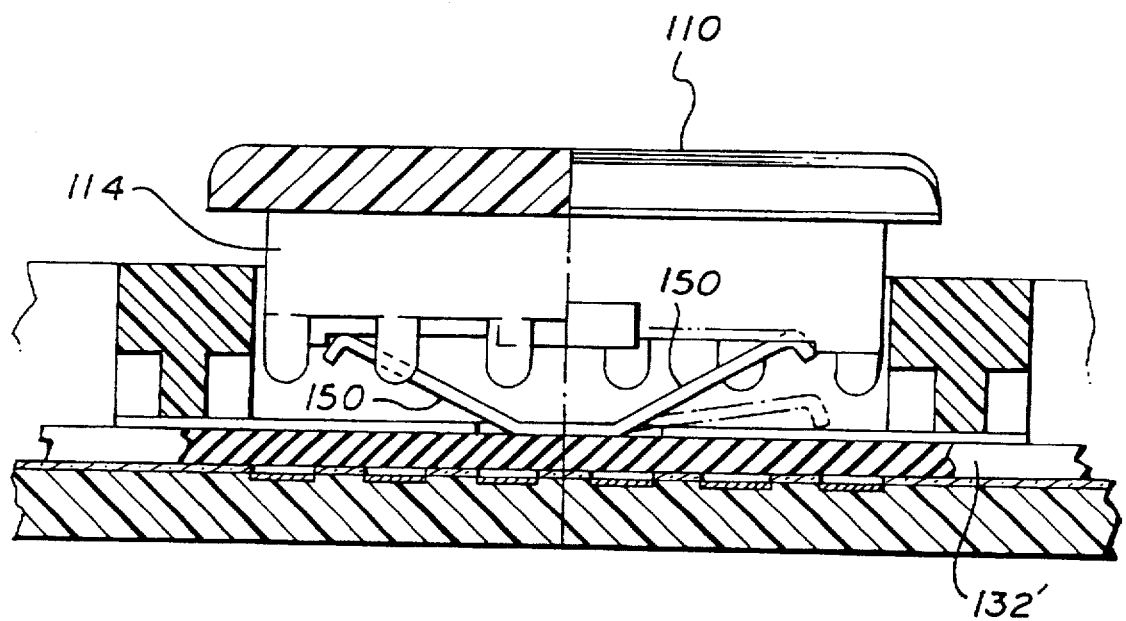
FIG. 9 is a broken cross-sectional view transverse to the view of FIG. 8.

FIGS. 8 and 9 illustrate an alternative embodiment of the invention. In this case, key 110 is identical to the key shown in FIGS. 5–7. However, the conductive membrane 132' is a flat sheet without the key bells of the previously described embodiment. Such a configuration may be desirable in certain high usage applications since the molded membrane shown in FIGS. 5 and 6 has a shorter fatigue life. Membrane 132' may be silicone rubber as in the previously described embodiment that is either impregnated with a conductive material or that has a conductive ink printed on the surface adjacent dielectric layer 128. Membrane 132' may also be made of other suitable elastic materials such as polyurethane, polyester or polycarbonate film, each of which would require application of a printed conductive ink.

In order to provide support for the keys and tactile feedback in this embodiment, springs 150 are provided. Each key is supported by four spring leaves acting against the underside of skirts 114. The left side of FIG. 9 shows spring 150 in its normal position with key 110 installed. The right side shows spring 150 in its fully relaxed position (in solid lines) and in its compressed position (in phantom lines). Springs 150 are preferably formed by stamping a sheet of a suitable alloy, but a polymeric material may also be suitable. A single stamping or molded polymeric component would provide support at all of the key sites on device 100.

Figure 10:
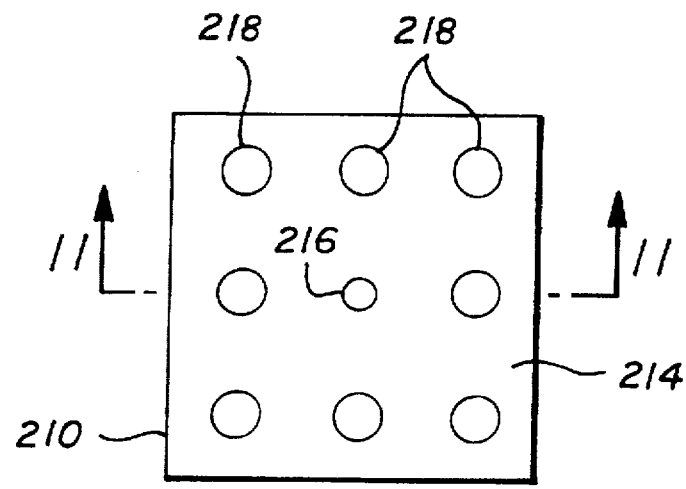
FIG. 10 is a plan view of an alternative embodiment utilizing an optical identification technique.
Figure 11:
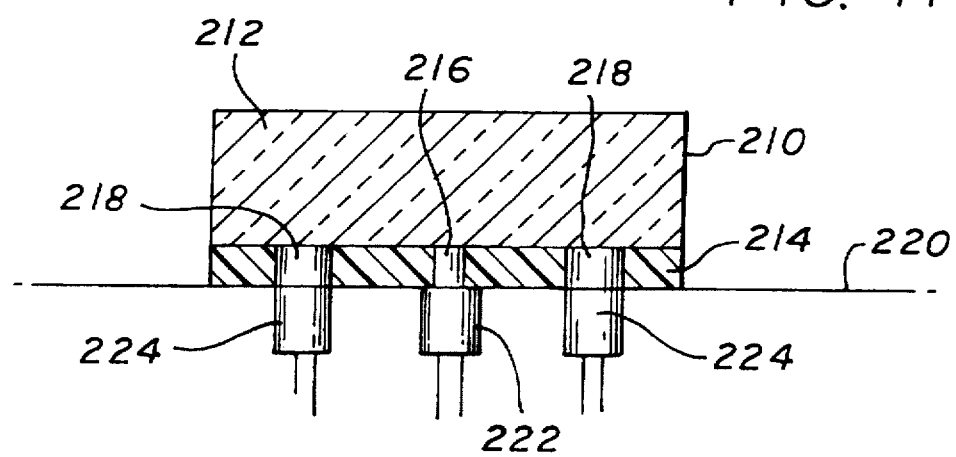
FIG. 11 is a cross-sectional view taken at line 11—11 of FIG. 10.

FIGS. 10 and 11 illustrate an alternative approach to achieving a user configurable control device. This approach employs an optical encoding technique to convey the identity of the function control elements. In the particular embodiment illustrated, infrared radiation from the human body is employed as an energy source for operation of the control element. Key 210 has a body portion 212 molded from a material that is optically translucent in the infrared region. The base portion 214 of the key is made of an optically opaque material. Base portion 214 has a pattern of apertures 218 with which the identification of key 210 is encoded. Every key has a central reference aperture 216, together with up to eight data apertures 218.

Key 210 is applied to substrate 220. An infrared sensor 222 is aligned with the position of reference aperture 216. Similar infrared sensors 224 are aligned with each of the eight possible positions of data apertures 218. Key 210 is actuated by simply placing a finger in close proximity to top surface 213. The infrared radiation emitted from the fingertip is detected by the reference sensor 222. When the energy level exceeds a predetermined threshold, thereby signifying actuation of key 210, the outputs of the data sensors 224 are latched and made available to the associated processor. Alternatively, reference aperture 216 may be omitted and an electrically generated reference level may be used. In this case, actuation of the key is sensed when the output of at least one of the data sensors 224 exceeds the predetermined threshold value. It should be noted that depression or other mechanical actuation of key 210 is not necessary in this embodiment; however, a suitable resilient mounting means may be employed to provide tactile feedback if desired.

As shown in FIG. 10, data apertures 218 are uniform in size and the key identification is a binary code based on the locations at which data apertures 218 are placed. Reference aperture 216 preferably has a smaller area than the data apertures to insure that there is a sufficient level of radiant energy to reliably read the identification code. In a modification of this embodiment, the areas of data apertures 218 may be of differing sizes. In this way, the number of available codes may be increased by a factor equal to the number of available steps in aperture size. Naturally, this modification requires that data sensors 224 be capable of distinguishing varying levels of incident radiation, and suitable analog to digital circuitry would be required to provide data inputs to the associated processor. A reference aperture 216 may still be employed to sense a threshold level of incident radiation and to scale the outputs of the data sensors.

Figure 12:
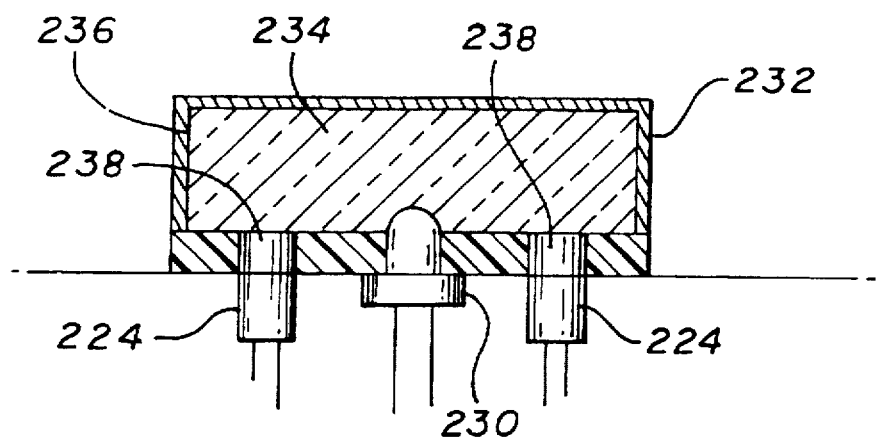
FIG. 12 is a cross-sectional view similar to that of FIG. 11 showing yet a different embodiment.

FIG. 12 illustrates a further modification of the above described embodiment. In this case, a light source such as light emitting diode (LED) 230 is provided at each key site. Key 232 has an optically translucent body portion 234 with an opaque outer coating 236. Upon actuation of key 232, LED 230 is illuminated and the light therefrom is dispersed within translucent body portion 234. Data apertures 238 selectively transmit the light as in the previously described embodiment to data sensors 224. As discussed above, apertures 238 may be either uniform or non-uniform in area, depending upon the number of identification codes that are desired.

Numerous other technologies may be employed to provide unique identifications for the individual control elements of this invention. For example, each of the control elements may contain a unique electronic component. This may be a resistor, inductor, capacitor, conductor, semiconductor or a combination of such components. The electrical characteristics of the component or combination of components would then be sensed by electronic circuitry in the control substrate when the control element is actuated. The component or combination of components contained within the operable element may be coupled to the control substrate by direct electrical contact. Alternatively, the control element may contain a resonant circuit, in which case the circuit may be inductively coupled without direct contact. Coupling by magnetic, electromagnetic, optical, mechanical or acoustic means, or by a combination of any such means may also be employed in certain embodiments.

In another embodiment, each key site of the control substrate may have a variable resistor, inductor or capacitor. Each of the operable elements has a uniquely shaped lug or other projection that mechanically interfaces with a wiper or movable core of the variable circuit element.

In yet another embodiment, each of the control elements may contain magnets of varying polarity, position and size. Hall effect or other magnetic sensors within the control substrate would detect the polarity, location and strength of the magnets within the operable element to decode the identification.

Still other embodiments include optical sensing of bar codes or similar indicia on the operable elements, acoustic sensing of the shape of the operable elements and inclusion of an active integrated circuit within each of operable elements.

The foregoing description has been limited to manually operable control elements in the form of keys. It will be recognized, however, that the present invention may be practiced with other types of control elements such as rotary knobs, slide switches, toggle switches or joysticks. It is only necessary that each control element contain one or more unique identifications and that each operator action cause a corresponding unique identification to be sensed. Thus, for example, a rotary knob may contain two separate and unique identifications, one of which is sensed when the knob is turned clockwise, the other being sensed when the knob is turned counter-clockwise.

The present invention has application not only for providing control inputs to a device, but also for performing display functions. In this regard, a display element with an inherent unique identification, analogous to the control elements described above, may be provided. Such a display element would have an associated unique display function that would be invariant regardless of where the display element is located on a suitable receiving substrate. The display element may include any one of a variety of display devices, such as an LED, LCD or the like. Although it is possible to have self powered display elements, it is more practical for the display elements to have direct electrical contact with the underlying substrate for providing power to the display device. Identification sensing may be performed using any of the techniques discussed above. In most cases, it will also be necessary to determine the particular site on the substrate at which the display element is located so that power can be properly routed to perform the display function.

The foregoing description has concentrated primarily on an embodiment of the present invention as a remote control transmitter. It is to be understood, however, that this is but an exemplary application of the fundamental invention. The invention is applicable to virtually any system or device that accepts control inputs. Other examples include appliances (e.g., microwave ovens), computers, calculators, telephones, electronic organizers and other personal electronic devices. Moreover, the invention need not be embodied in a remote control transmitter, but may instead be implemented as part of a control panel on the device itself.

The utility of the invention is also not limited to controlling discrete functions of devices. In this regard, devices may be provided to consumers with an assortment of buttons or other control elements that may be used to establish a selected configuration of the device or to establish certain operational preferences. In such an application, the device itself may be provided with otherwise conventional controls, but would include a designated location or "hot spot" where a control element selected from a set of such elements provided to the consumer would be momentarily placed and activated to choose the desired configuration or preferences. Control elements with multiple active surfaces and multiple corresponding functions are particularly suitable for this application since configuration settings or preferences are changed infrequently and generally involve mutually exclusive choices. Elements that are used in conjunction with a "hot spot" or other fixed location on a control panel may be "operated" by means separate from the element itself. For example, It may be more convenient to provide a separate push-button or similar device to operate the "hot spot" so that the selected element need only be positioned at the appropriate spot.

Control elements for establishing a configuration or selecting preferences would be most conveniently stored in an instructional or operating manual. By doing so, these special purpose elements would be readily available when needed, but would not occupy space on the control panel itself. The instructional or operating manual may be configured to include suitable pockets or other compartments for storing the special purpose elements.

It will be recognized that the above described invention may be embodied in other specific forms without departing from the spirit or essential characteristics of the disclosure. Thus, It is understood that the invention is not to be limited by the foregoing illustrative details, but rather is to be defined by the appended claims.

We claim:

1. A function control device comprising:

a housing having a key receiving surface;

a plurality of optical sensors disposed within the housing for sensing radiation at the key receiving surface;

a plurality of function control keys, each having an opaque base portion with a plurality of apertures therein, each of said apertures disposed for operative alignment with a corresponding one of the plurality of optical sensors when the function control key is placed on the key receiving surface, said plurality of apertures being arranged in a predetermined pattern that is unique for each one of the plurality of function control keys;

whereby illumination of a selected one of the plurality of function control keys causes a unique pattern of radiation to be incident upon the plurality of optical sensors.

2. The function control device of claim 1 wherein the optical sensors are sensitive to infrared radiation emitted by the human body.

3. The function control device of claim 1 further comprising a source of illumination disposed on the key receiving surface and wherein the base portion of each of the plurality of function control keys includes an aperture for, admitting the source of illumination.

4. The function control device of claim 1 wherein the pattern of apertures is a binary pattern of equal size apertures.

5. The function control device of claim 1 wherein each of the plurality of apertures has an area that is selected from a set of graduated sizes.

6. The function control device of claim 1 wherein the plurality of optical sensors includes a reference sensor at each of a plurality of key receiving sites and wherein each of the plurality of control elements includes a reference aperture in operative alignment with a respective reference sensor.

* * * * *

UNITED STATES PATENT AND TRADEMARK OFFICE
CERTIFICATE OF CORRECTION

PATENT NO.  :  5,729,222
DATED  :  March 17, 1998
INVENTOR(S)  :  Iggulden et al.

It is certified that error appears in the above-identified patent and that said Letters Patent is hereby corrected as shown below:

Title page item [57],
In the abstract, at line 11, please delete "look" and insert --lock--.

In column 2, at line 64 please delete "Alteratively" and insert --Alternatively--.

In column 3, at line 57, please delete "am" and insert --are--.

In column 5, at line 45, please delete "from" and insert --front--.

In column 10, at line 61, please delete "It" and insert --it--.

In column 12, claim 3, at line 10 please delete "for," and insert --for--.

Signed and Sealed this

Twenty-ninth Day of February, 2000

Attest:

Q. TODD DICKINSON

Attesting Officer

Commissioner of Patents and Trademarks